United States Patent [19]
Ito et al.

[11] Patent Number: 5,251,091
[45] Date of Patent: Oct. 5, 1993

[54] SOLENOID DRIVING CIRCUIT FOR AUTOMATIC TRANSMISSION

[75] Inventors: Yasunobu Ito, Okazaki; Kunihiro Yamada, Anjo, both of Japan

[73] Assignee: Aisin AW Co, Ltd., Japan

[21] Appl. No.: 717,193

[22] Filed: Jun. 18, 1991

[30] Foreign Application Priority Data

Jun. 18, 1990 [JP] Japan ................................. 2-159531

[51] Int. Cl.$^5$ .......................................... H01H 47/32
[52] U.S. Cl. ................................. 361/152; 123/490; 361/194; 361/205
[58] Field of Search .................. 361/152.4, 160, 194, 361/205, 42, 45, 49; 307/9.1, 10.1; 251/129.05; 123/490

[56] References Cited
U.S. PATENT DOCUMENTS 4,589,401  5/1986  Karim et al. ........................ 123/479

Primary Examiner—Jeffrey A. Gaffin
Attorney, Agent, or Firm—Lorusso & Loud

[57] ABSTRACT

A solenoid driving circuit for an automatic transmission in which a potential difference compensating device, such as a Darlington-connected transistor circuit, switching transistor, and/or diode, is connected between a resistance element and a power ground, and a controlling device monitors voltage values at opposite sides of the resistor element so as to detect a current value flowing across a solenoid. The controlling device determines whether the detected value of the current flowing across the solenoid is abnormal, and the controlling device shuts off the current of a solenoid driving device when it is abnormal. The potential difference compensating device is provided with a switching device, and the controlling device turns off the switching device when the monitoring current value is abnormal. This circuit prevents an excessive current from flowing to the solenoid and an excessive discharge from the potential difference compensating device to the power ground owing to a short circuit with the supply line of a battery.

4 Claims, 10 Drawing Sheets

| POSITION | | SL1 | SL2 | SL3 | SLU | C0 | C1 | C2 | C3 | B1 | B2 | B3 | B4 | F0 | F1 | F2 | F3 |
|---|---|---|---|---|---|---|---|---|---|---|---|---|---|---|---|---|---|
| P | | × | — | — | × | | | | | | | | ○ | | | | |
| R | V≤7 | × | — | — | ⊕ | | ○ | | | | ○ | ○ | | | | | |
| R | V>7 | ○ | — | — | × | | ○ | | | × | ○ | ○ | | | | | |
| N | | × | — | — | × | | | | | | | | ○ | | | | |
| D | 1ST | × | ○ | ○ | ⊗ | ○ | | | | | | | ○ | | | ○ | ○ |
| D | 2ND | × | ○ | × | ⊗ | ○ | | | | | ○ | | ○ | | | | ○ |
| D | 3RD | ○ | ○ | × | ◎ | ○ | | | ○ | ⊖ | ○ | | | | ○ | | |
| D | 4TH | ○ | × | × | ◎ | ○ | ○ | | ○ | | ○ | | | ○ | | | |
| D | 5TH | × | × | ○ | ◎ | ○ | ○ | | ○ | | | | | ○ | | | |
| D | (4TH) | × | × | × | × | ○ | ○ | | ○ | | ○ | | | ○ | | | |
| 3 | 1ST | × | ○ | ○ | ⊗ | ○ | | | | | | ○ | ○ | | | ○ | ○ |
| 3 | 2ND | × | ○ | × | ⊗ | ○ | | | | ○ | ○ | ○ | | | ○ | | ○ |
| 3 | 3RD | ○ | ○ | × | ◎ | ○ | | | ○ | ⊖ | ○ | | | | ○ | | |
| 3 | 4TH | ○ | × | × | ◎ | ○ | ○ | | ○ | | ○ | | | ○ | | | |
| 3 | (4TH) | × | × | × | × | ○ | ○ | | ○ | | ○ | | | ○ | | | |
| 2 | 1ST | × | ○ | ○ | ⊗ | ○ | | | | | | | ○ | | | ○ | ○ |
| 2 | 2ND | × | ○ | × | ⊗ | ○ | | | | ○ | ○ | | ○ | | | | ○ |
| 2 | 3RD | ○ | ○ | × | ◎ | ○ | | | ○ | ⊖ | ○ | | | | ○ | | |
| 2 | (4TH) | × | × | × | × | ○ | ○ | | ○ | | ○ | | | ⊙ | | | |
| 1 | 1ST | × | ○ | ○ | ⊗ | ○ | | | | | ○ | ○ | ○ | | | ○ | ○ |
| 1 | 2ND | × | ○ | × | × | ○ | | | | ○ | ○ | ○ | | | ○ | | ○ |
| 1 | (2ND) | × | × | × | × | ○ | | | | ○ | ○ | ○ | | | ○ | | ○ |

FIG. 7

| | ON:L-UP ON / OFF:L-UP OFF | |
|---|---|---|
| ○ | ON | APPLIED |
| × | OFF | RELEASE |
| ◎ | | |
| ⊗ | | N→D CONTROL |
| ⊕ | | N→R CONTROL |
| — | | |
| ⊖ | | |

TURNED ON ONLY AT LOW THROTTLE OPENING

TURNED ON AND OFF ON THE BASIS OF VEHICLE SPEED AND THROTTLE OPENING

SOLENOID DRIVING CIRCUIT FOR AUTOMATIC TRANSMISSION

BACKGROUND OF THE INVENTION

Field of the Invention

The present invention relates to a solenoid driving circuit for an automatic transmission which includes a solenoid disposed in a hydraulic pressure controller of an automatic transmission for a vehicle and adapted to control hydraulic pressure supplied thereto, a solenoid driving means for driving the solenoid with a set electric current, a resistance element selectively connected in series with the solenoid, and a controlling means for effecting feedback control so as to adjust the electric current of the solenoid driving means to a set value by detecting a potential difference between the ends of the resistance element, the resistance element being connected to a power ground and the controlling means to a signal ground, respectively.

Description of the Related Art

A hydraulic controller of an electronically controlled automatic transmission for a vehicle is arranged such that electric current supplied to an actuator such as a linear solenoid is controlled so as to control the hydraulic pressure within the hydraulic controller, e.g. hydraulic pressure (line pressure) applied to a clutch serving as a transmission mechanism to a brake and the like.

Since the conventional driving current for linear solenoids creates noise, there are cases where such driving current results in a malfunctioning of the electronic controller or of peripheral electronic devices or signals.

Accordingly, as a measure against this problem, an arrangement is provided wherein the ground signal of the electronic controller is divided, as required, into a ground for a driving current (power ground (PG)) for driving the linear solenoid and the like and a ground for a control signal (signal ground (SG)) for a microcomputer, an interface circuit, and the like inside the electronic controller, respectively.

FIGS. 4 and 5 show a conventional example of a linear solenoid driving circuit for an automatic transmission.

In FIG. 4, an electronic controller 1 controls electric current for a linear solenoid by receiving as its input a signal from a throttle sensor 12 which in turn generates line pressure for the automatic transmission corresponding to the throttle opening. In the electronic controller 1, a throttle-opening determining means 2 determines the throttle opening by converting the analog signal of the throttle sensor 12 to a digital signal (A/D conversion) so as to determine the throttle opening. A linear solenoid current setting means 3 sets a linear solenoid current value for generating line pressure for the automatic transmission corresponding to the throttle opening. A PWM (Pulse Width Modulated) signal outputting means 4 corrects the basic pulse width set by the linear solenoid current setting means 3, by means of a correction value created by a monitoring current comparing/correcting means 6 which produces a PWM signal whose pulse width is controlled at a fixed (constant and predetermined) frequency of, for instance, 300 Hz. Solenoid driving means 5 is adapted to drive the linear solenoid 13 by means of that PWM signal.

A current monitoring means 10 and a monitoring current detecting means 8, which are current/voltage converting elements, monitor the electric current actually flowing across the linear solenoid 13. A circuit constituted by a monitoring current determining means 7 and the monitoring current comparing/correcting means 6 corrects the PWM signal on the basis of a monitoring value of the current monitoring means 10 and the monitoring-current detecting means 8. Here, the current monitoring means 10 has one terminal connected to the linear solenoid 13 and the other terminal to the power ground and produces a voltage proportional to the value of the current flowing across the linear solenoid 13 with respect to the power ground. The monitoring current detecting means 8 smooths that voltage, converts the same to a pulsation-free, stable voltage waveform, and restricts the electric potential to a range readable by a microcomputer, as a countermeasure against noise. The monitoring current determining means 7 converts a signal from the monitoring means 8 to, for instance, a digital signal by means of A/D conversion so as to determine a monitoring current value. Meanwhile, the monitoring current comparing/correcting means 6 compares the monitoring current value with a linear solenoid current value set by the linear solenoid current setting means 3, generates a correction signal corresponding to error detected by the comparison and feeds back that correction signal to the PWM signal outputting means 4. In addition, the monitoring current determining means 7 determines whether or not the current value is abnormal and, if the current value is determined to be abnormal, turns off the PWM signal via the monitoring current comparing/correcting means 6.

With the above-described configuration in which the grounding signal is divided, the following problem occurs:

Even though the signals are the same grounding signals, a difference in potential exists between the power ground and the signal ground owing to the effects of the difference in current flowing through the respective power ground and signal ground as well as the difference in resistance to the battery ground. As a result, a problem occurs in that the monitored value of the current which equalizes the current of the linear solenoid to a set value is erroneously determined, causing the current value to deviate from the set value. Specifically, the current flowing through the power ground is greater than the current flowing through the signal ground, so that the potential is higher at the power ground. Accordingly, the monitored value of the current flowing across the linear solenoid becomes greater than the current which actually flows, so that the actual current value of the linear solenoid becomes lower than the set value. As a result, the line pressure of the automatic transmission becomes higher than normal, leading to an aggravated shock at the time of speed change. In addition, since this potential difference is affected by the difference between the respective currents and the difference attributable to the resistance of the wire harness and the like, if the current flowing through the signal ground becomes greater than the current flowing through the power ground, the actual current value of the linear solenoid becomes higher than the set value. As a consequence, the line pressure of the automatic transmission becomes lower than normal, so that the durability of clutches, in speed change mechanisms, brakes and the like is reduced.

SUMMARY OF THE INVENTION

Accordingly, it is an object of the present invention to provide a simple solenoid driving circuit for an automatic transmission capable of accurately monitoring the electric current to a linear solenoid without resulting in variations in a resistance element or requiring fine adjustment thereof, thereby overcoming the above-described drawbacks of the conventional art.

Another object of the present invention is to provide fail-safe control against short-circuiting of a linear solenoid.

To these ends, in accordance with the present invention there is provided a solenoid driving circuit for an automatic transmission comprising: a solenoid disposed in the hydraulic controller of an automatic transmission for a vehicle and adapted to control hydraulic pressure supplied thereto; solenoid driving means for driving the solenoid with a current at a set value; a resistance element electrically connected in series with the solenoid; controlling means for effecting feedback control responsive to a detected difference in potential between opposite ends of the resistance element in such a manner that the current flowing across the solenoid driving means conforms to the set value, the resistance element being connected to a power ground and the controlling means to a signal ground; and potential difference compensating means connected between the resistance element and the power ground, wherein the controlling means is provided with abnormality determining means for determining whether or not a monitoring current value is abnormal and for shutting off the current to the solenoid driving means when the monitoring current value is abnormal. Alternatively, the potential difference compensating means is provided with switching means, and the controlling means is provided with abnormality determining means for turning off the switching means when the monitoring current value is abnormal.

In the solenoid driving circuit for an automatic transmission in accordance with the present invention, a potential difference compensating means 11 is connected between a resistance element 10 and the power ground, and controlling means 3, 4, 6, 7, 8 and 9; monitor voltage values at opposite sides of the resistor element 10 so as to detect the current value flowing across the solenoid 13. Accordingly, even if there is difference in potential between the power ground to which the resistance element 10 is connected and the signal ground to which the controlling means 3, 4, 6, 7, 8 and 9 are connected, it is possible to detect a voltage proportional to the current value irrespective of the difference in potential, thereby making it possible to improve control accuracy. In addition, the controlling means 3, 4, 6, 7, 8 and 9 are adapted to determine whether the detected value of the current flowing across the solenoid is abnormal, and shut off the current of a solenoid driving means 5 when it is abnormal. Alternatively, an arrangement may be provided such that the potential difference compensating means are provided with switching means, and the controlling means 3, 4, 6, 7, 8 and 9 are adapted to turn off the switching means when a monitoring current value is abnormal. Accordingly, even when a short-circuiting fault occurs, it is possible to prevent excessive current from flowing to the solenoid 13 and to prevent an excessive discharge from the potential difference compensating means 11 to the power ground due to a short circuit with the supply line of the battery.

The above and other objects, features and advantages of the present invention will become more apparent from the following detailed description of the invention when read in conjunction with the accompanying drawings.

BRIEF DESCRIPTION OF THE DRAWINGS

FIG. 7 is a diagram illustrating the operating modes of the automatic transmission.

DESCRIPTION OF THE PREFERRED EMBODIMENT

Referring now to the accompanying drawings, a description will now be given of the preferred embodiment of the present invention.

Figure 1:
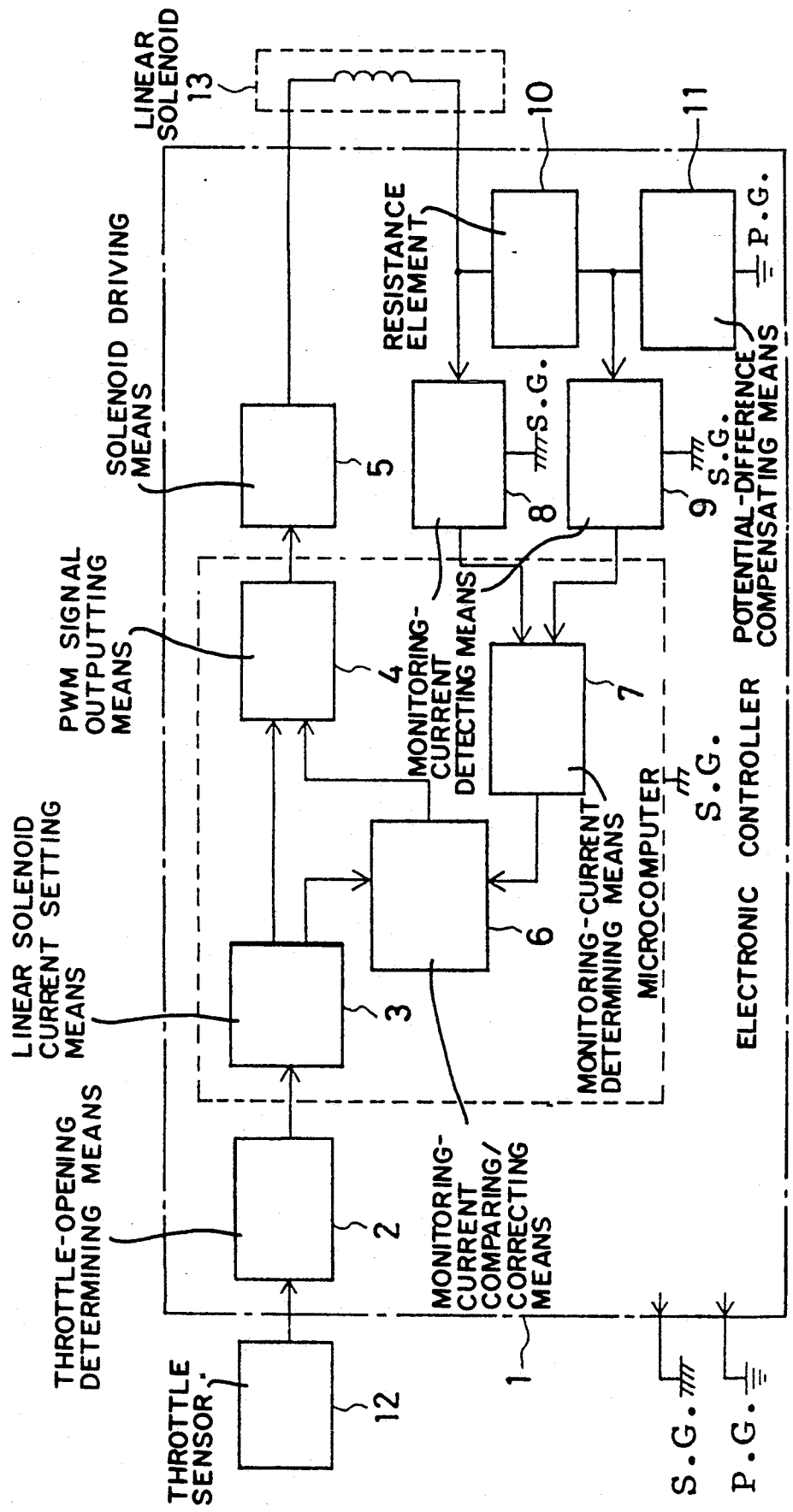
FIG. 1 is a diagram illustrating an embodiment of a solenoid driving circuit for an automatic transmission in accordance with the present invention.

FIG. 1 is a diagram illustrating an embodiment of a solenoid driving circuit for an automatic transmission in accordance with the present invention. As shown in the drawing, the solenoid driving circuit includes the following components: an electronic controller 1; a throttle-opening determining means 2; a linear solenoid current setting means 3; a PWM signal outputting means 4; a solenoid driving means 5; a monitoring current comparing/correcting means 6; a monitoring current determining means 7; monitoring current detecting 8 and 9; a resistance element 10; a potential difference compensating means 11; a throttle sensor 12; and a linear solenoid 13.

Figure 4:
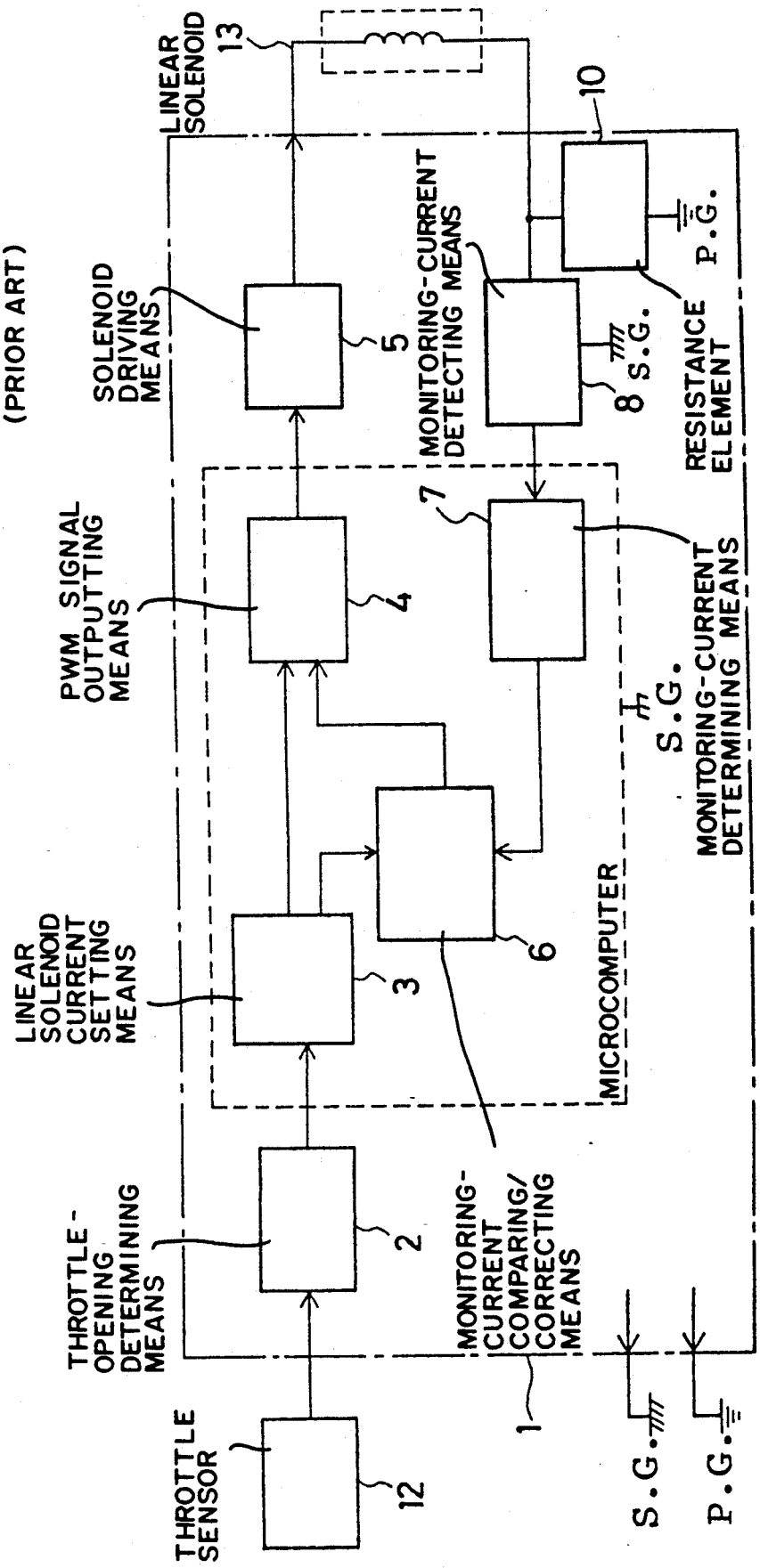
FIGS. 4 and 5 are diagrams illustrating a linear solenoid driving circuit for an automatic transmission in accordance with the prior art.

In FIG. 1, the potential difference compensating means 11 is inserted and connected in series between the resistance element 10 and a power ground, and compensates for a fixed voltage with respect to the power ground. The monitoring current detecting means 8, 9 convert the voltage into a smooth voltage waveform which is free from pulsation by effecting smoothing, and ensure that the voltage of 5 V or more in the scale of an A/D converter or a motor current determining means will not be inputted to the A/D converter. The monitoring current detecting means 8 is used to input an input end voltage $V_{F1}$ from the resistance element 10 to a computer and the monitoring current detecting means 9 is used to input an input end voltage $V_{F2}$ from the potential difference compensating means 11 to the computer. The monitoring current determining means 7 receives as its inputs an output voltage $V_{F1'}$ generated by the monitoring current detecting means 8 and an output voltage $V_{F2'}$ as detected by the monitoring current detecting means 9, obtains a difference $V_1$, therebetween by effecting A/D conversion, and thereby determines a value for the current flowing across the linear solenoid 13. It should be noted that since the other aspects of the configuration are identical with those of the means denoted by the same reference numerals and described earlier in connection with FIG. 4, a description thereof will be omitted.

A description will now be given of the operation of the above-described circuit. As is apparent from the drawing, the input end voltage $V_{F1}$ is a value in which a voltage drop $V_1$ at the resistance element 10 caused by current flowing across the linear solenoid 13 is added to the input end voltage $V_{F2}$ of the potential difference compensating means 11. In addition, if it is assumed that the potential difference between the power ground to which the potential difference compensating means 11 is connected and the signal ground to which the monitoring current detecting means 8, 9 are connected is $\Delta V$, the output voltage $V_{F1'}$ detected by the monitoring current detecting means 8 becomes $$V_{F1'} = V_{F1} \pm \Delta V$$

and the output voltage $V_{F2'}$ detected by the monitoring current detecting means 9 becomes $$V_{F2'} = V_{F2} \pm \Delta V$$

so that the difference $V_{1'}$ therebetween obtained by the monitoring current determining means 7 becomes $$\begin{aligned} V_{1'} &= V_{F1'} - V_{F2'} \\ &= (V_{F1} \pm \Delta V) - (V_{F2} \pm \Delta V) \\ &= V_{F1} - V_{F2} = V_1 \end{aligned}$$

where $V_1$ is a voltage proportional to the value of the actual current flowing across the linear solenoid 13, and is a voltage which is not affected by the potential difference $\Delta V$ between the power ground and the signal ground.

Figure 2:
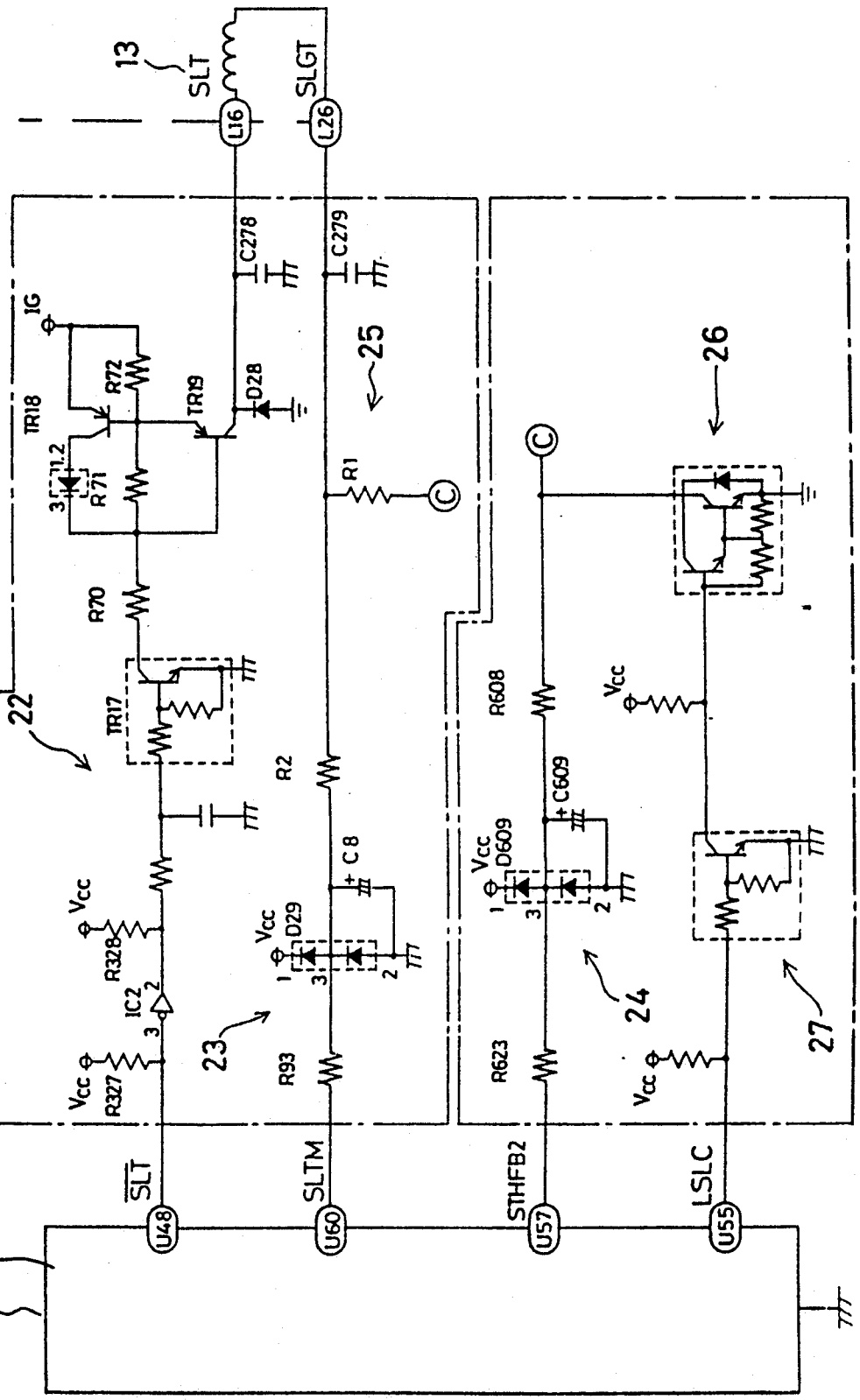
FIG. 2 is a diagram illustrating an example of a potential difference compensating means.
Figure 3A:
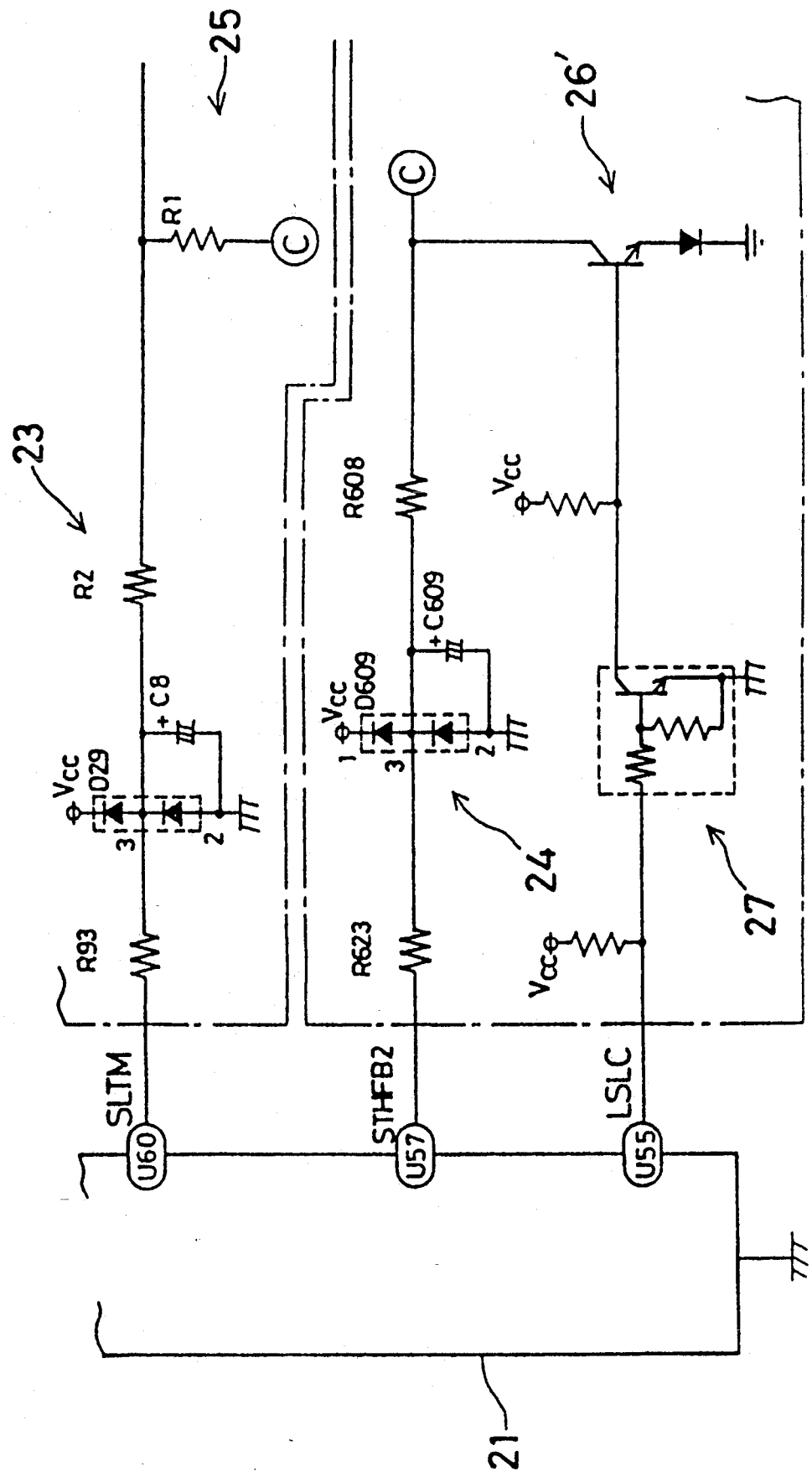
FIGS. 3(a) and 3(b) are diagrams illustrating other examples of the potential difference compensating means.
Figure 3B:
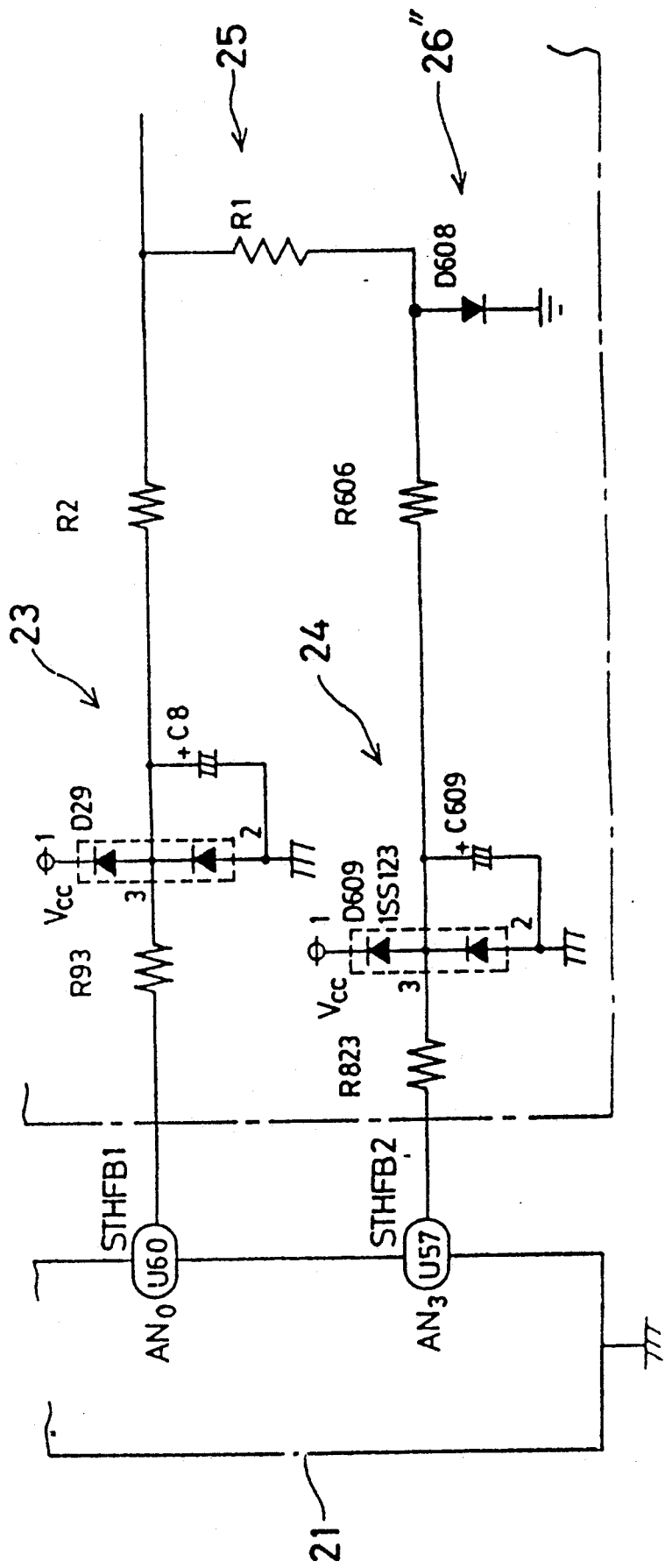

FIG. 2 is a diagram illustrating an example of the potential difference compensating means, and FIGS. 3(a) and 3(b) show other examples of the potential difference compensating means.

Figure 5:
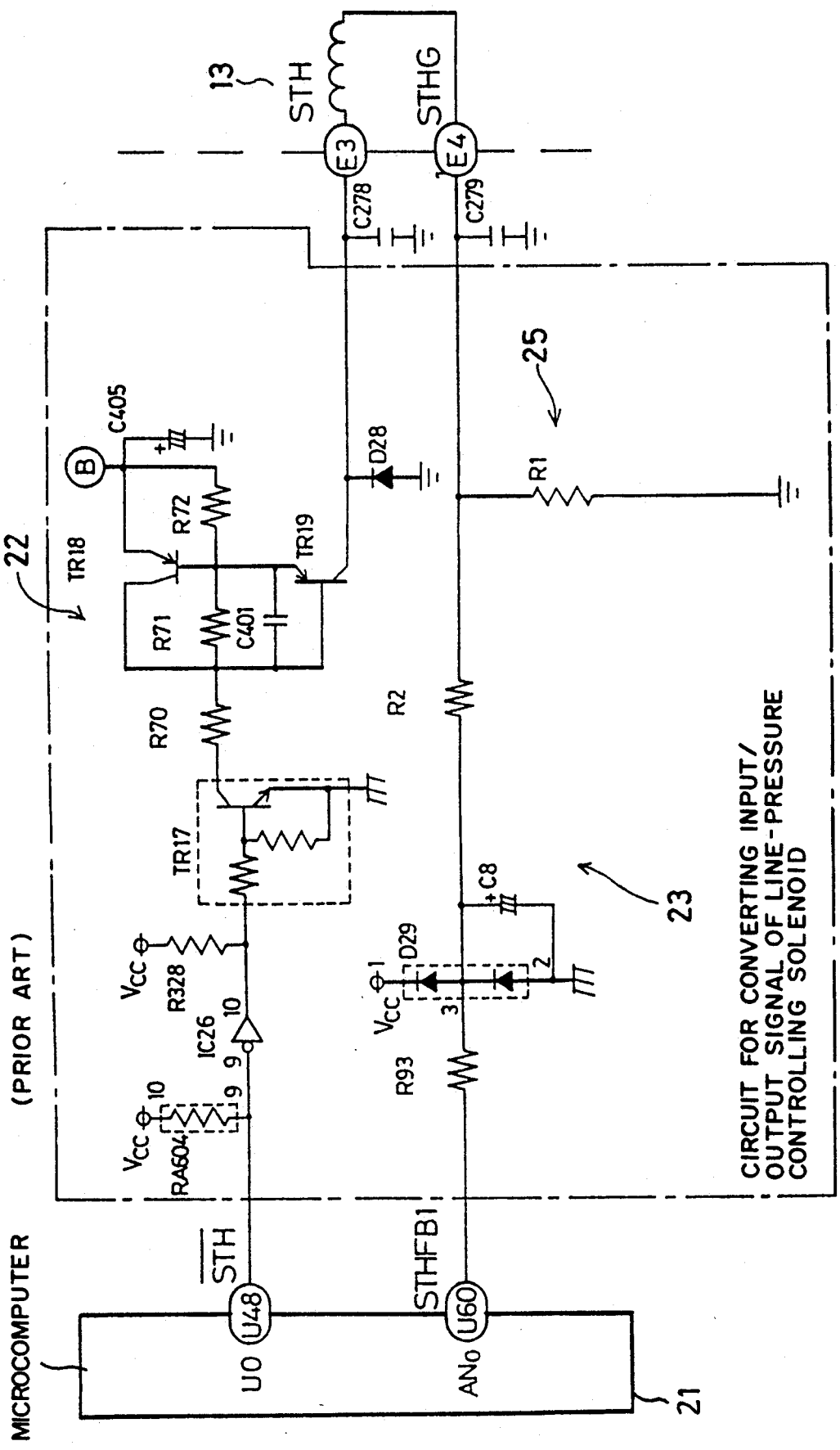

FIG. 2 shows an example of application of the present invention in which the potential difference compensating means and the resistance element are added to the circuit shown in FIG. 5 described earlier. In this example, a voltage of approximately 1.2 V is compensated for by using a Darlington-connected transistor circuit as a potential difference compensating means 26, and a circuit comprising resistors R608, R623, a capacitor C609, and a diode D609 is used as a monitoring current detecting means 24. Accordingly, a microcomputer 21 samples the voltages $V_{F1'}$, $V_{F2'}$ from terminals U60, U57 to determine the difference $V_1$ therebetween, feeds back the same to the solenoid drive controlling system, and corrects the PWM signal outputted from the terminal U48.

In the above-described configuration, in a case where a short circuit has occurred between the terminals of the linear solenoid 13 or between one line of the linear solenoid 13 and the supply line of the battery owing to breakdown of the insulation, the voltage V1 becomes abnormally high. In addition, in the case where a short circuit has occurred between one terminal of the linear solenoid and ground, the voltage $V_1$ becomes abnormally low. Accordingly, upon detection of any of the aforementioned abnormalities by monitoring the voltage $V_1$, the PWM signal is turned off, while, at the same time, a terminal U55 is turned on and the base of the Darlington connected transistor circuit is grounded so as to turn off the transistor circuit. By virtue of this arrangement, even if any of the above-described short-circuiting faults occurs, it is possible to prevent excessive current from flowing through the linear solenoid 13, current monitoring means 25, and the potential difference compensating means 26, which would otherwise lead to abnormal operation of the linear solenoid, burning of the coil, or other similar faults.

FIGS. 3(a) and 3(b) show other examples of the potential difference compensating means in accordance with embodiments of the present invention. In FIG. 3(a), a potential difference compensating circuit 26' is configured by using a series circuit comprising a switching transistor and a diode instead of using the Darlington connected transistor circuit. In FIG. 3(b), a potential difference compensating circuit 26'' is configured by using a diode alone. It should be noted that, in the case of the example shown in FIG. 3(a), upon detection of the abnormality in the same way as in FIG. 2, the switching transistor is turned off, so that even if a short circuit occurs between one line of the linear solenoid 13 and the supply line of the battery, it is possible to shut off current from the battery. In the case of the example shown in FIG. 3(b), on the other hand, where the terminals of the linear solenoid 13 are short-circuited, or any of the terminals of the linear solenoid and the ground are short-circuited, by turning off the PWM signal supplied from the terminal U48 of the microcomputer, transistors TR17, TR19 can be turned off, thereby shutting off the current flowing to the linear solenoid 13. However, when a short-circuit occurs between the supply line of the battery and the input side of the linear solenoid 13, it is impossible to shut off the current flowing from the battery via the linear solenoid 13, the resistor R1 of the current monitoring means 25, and the diode D608 of the potential difference compensating means 26''. Also, when a short-circuit occurs between the supply line of the battery and the output side of the linear solenoid 13, it is also not possible to shut off the current flowing from the resistor R1 of the current monitoring means 25 and the diode D608 of the potential difference compensating means 26''. The same also applies in the conventional example shown in FIGS. 4 and 5.

To solve the above-described problems, in the examples shown in FIGS. 2 and 3(a), since both the current flowing to the linear solenoid 13 and the current on the power ground side are turned off during each of the above-described short-circuiting faults, it is possible to provide a fail-safe arrangement for the linear solenoid 13 and to prevent excessive discharge of the battery and burning of resistors in the current containing the linear solenoid 13 and the current monitoring means 9. Thus, the configurations of these examples are advantageous over those of FIGS. 3(b) and conventional examples.

Hereinafter, a description will be given of an example of an automatic transmission using a solenoid controlled by the above-described circuit as well as an example of a hydraulic control circuit to operate it.

Figure 6:
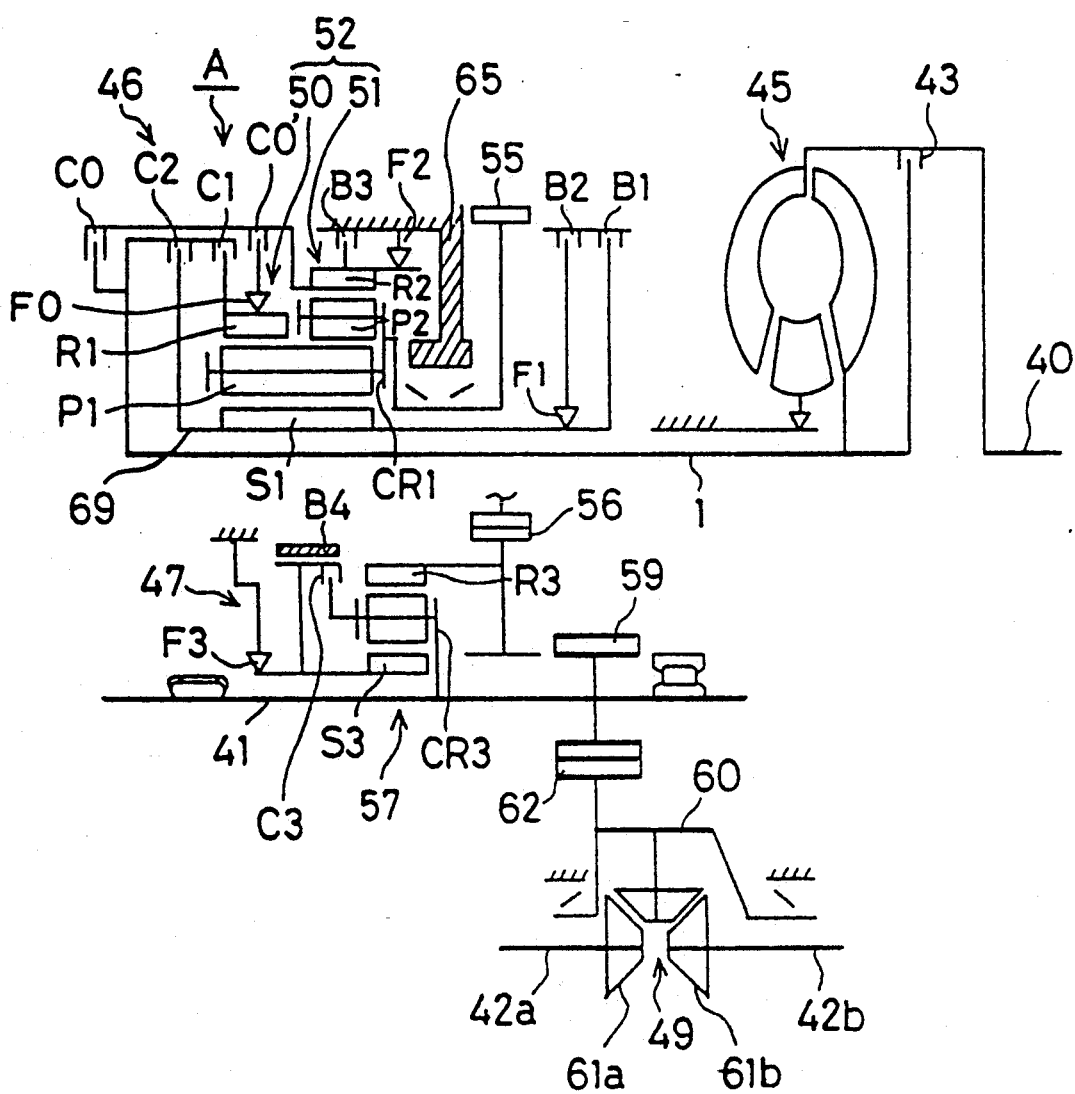
FIG. 6 is a schematic diagram of a gear train of an automatic transmission.
Figure 8A:
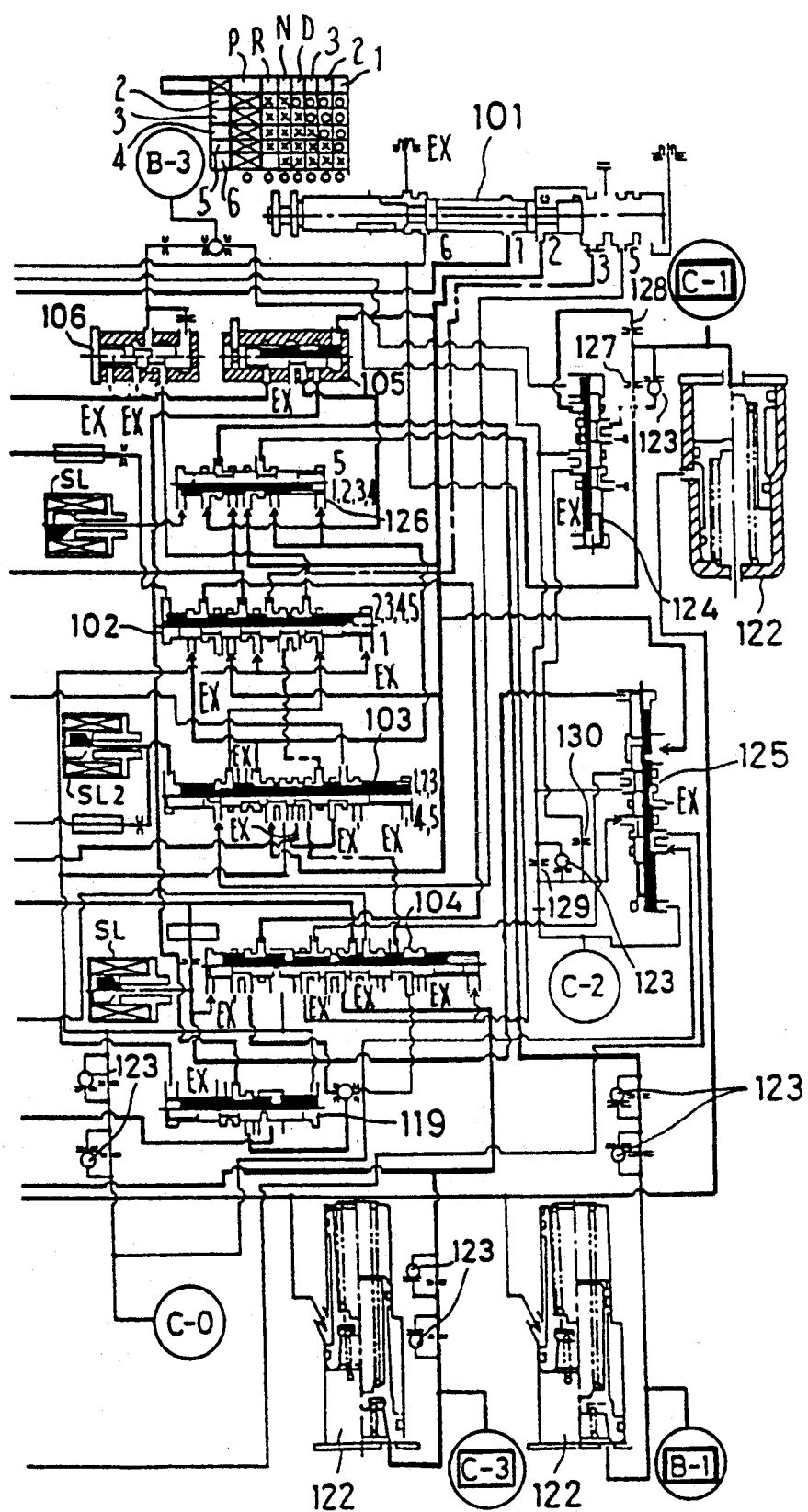
FIGS. 8(a) and 8(b) are diagrams illustrating a configuration of a hydraulic control circuit for an automatic transmission.
Figure 8B:
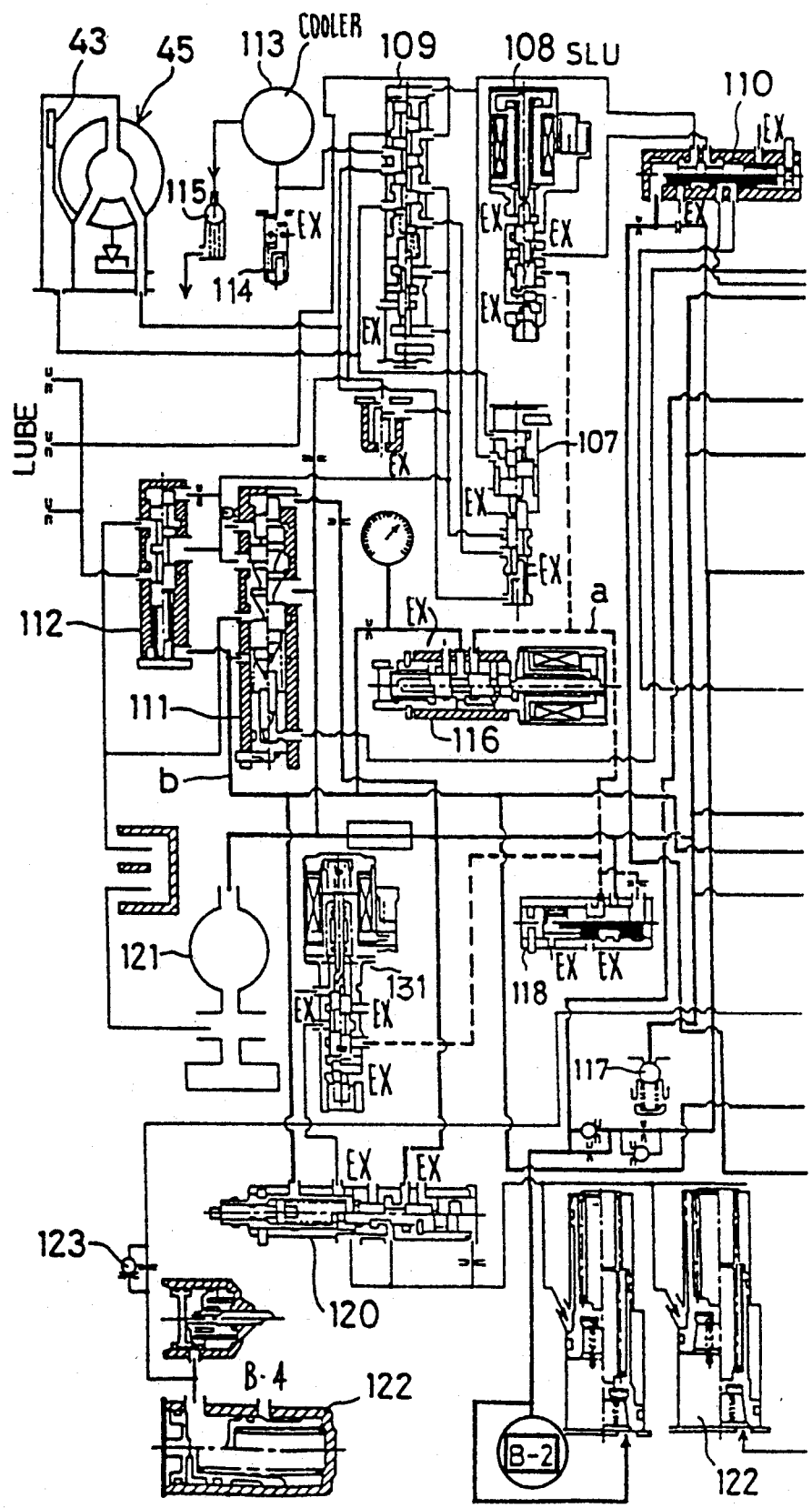

FIG. 6 is a schematic diagram illustrating a gear train of an automatic transmission; FIG. 7 is a diagram illustrating the operating modes of the automatic transmission; and FIGS. 8(a) and 8(b) are diagrams illustrating the configuration of the hydraulic control circuit for the automatic transmission.

As shown in FIG. 6, an automatic transmission A includes an engine crankshaft 40, an input shaft I, a counter shaft 41, and front axles 42a, 42b. A torque converter 45 having a lockup clutch 43 as well as a forward 4-speed automatic transmission mechanism 46 are disposed on the input shaft 1. In addition, an underdrive mechanism 47 is disposed on the counter shaft 41, while a front differential gear 49 is disposed on the front axles 42a, 42b.

The forward 4-speed automatic transmission mechanism 46 has a planetary gear unit 52 which combines a single planetary gear 50 and a dual planetary gear 51. This planetary gear unit 52 is arranged in such a manner that sun gears S1 and carriers CR1 of the two planetary gears 50, 51 are integrally connected to each other such that pinions meshing with the sun gears S1 of the planetary gears 50, 51 are integrally arranged along a long pinion P1. In addition, the sun gears S1 are formed integrally with a hollow shaft 69 supported on an outer periphery of the input shaft 1.

The input shaft 1 and the ring gear R1 (small ring gear) of the single planetary gear 50 are coupled together via a forward first clutch C1, while the input shaft 1 and the sun gears S1 are coupled together via a reverse second clutch C2. In addition, the sun gears S1 engage case 65 by means of a first brake B1, and also engage case 65 unidirectionally by means of a second brake B2 via a first one-way clutch F1. The large ring gear R2 of the dual planetary gear 51 engages the case 65 by means of a third brake B3 and unidirectionally by means of a second one-way clutch F2. In addition to these arrangements, there are provided a fourth clutch C0 for coupling the input shaft 1 with the large ring gear R2, as well as a clutch C0' and a fourth one-way clutch F0 which interlock with the fourth clutch C0 and are positioned between the large ring gear R2 and the small ring gear R1. Additionally, a counter drive gear 55 supported by case 65 partition wall couples with the carrier CR1 so as to serve as an output member.

The underdrive mechanism 47 has a simple planetary gear 57. The carrier CR3 of this simple planetary gear 57 is coupled with the sun gear S3 via a direct third clutch C3. The sun gear S3 engages case 65 by means of a fourth brake B4 for underdrive, and engages case 65 unidirectionally by means of a third one-way clutch F3. In addition, the ring gear R3 of the simple planetary gear 57 meshes with the counter drive gear 55 and is coupled with a counter driven gear 56 serving as an input member of the underdrive mechanism 47. Coupled with and fixed to the counter shaft 41 are the carrier CR3 of the simple planetary gear 57 and a reduction gear 59 serving as an output member of the underdrive mechanism 47.

The front differential gear 49 has a differential carrier 60 and left and right side gears 61a, 61b. Furthermore, a ring gear 62 is secured to the differential carrier 60 serving as a gear mounting case, and a reduction gear 59 of the underdrive mechanism 47 meshes with the ring gear 62, thereby forming a final reduction mechanism. The left and right side gears 61a, 61b are coupled with the left and right front axles 42a, 42b, respectively. With the above-described automatic transmission A, the shifting of each speed-change stage is effected among the ranges of P, R, N, D, 3, 2, 1 selected by a manual shift lever. FIG. 7 shows a table corresponding to the operating states of the clutches, brakes, and one-way clutches in the respective speed-change stages. FIGS. 8(a) and 8(b) illustrate a configuration of a hydraulic control circuit for controlling the operation of these clutches, brakes, and one-way clutches, and the electronic controller controls the solenoids of this hydraulic control circuit.

In FIGS. 8(a) and 8(b), the hydraulic control circuit includes the following components: the lockup clutch 43, the torque converter 45, hydraulic servos C-1 to C-3 for the clutches C0-C3 shown in FIG. 6, hydraulic servos B-1 to B-3 for the brakes B0-B3 shown in FIG. 6, a manual shift valve 101, a 1st-2nd shift valve 102, a 3rd-4th shift valve 103, a 2nd-3rd shift valve 104, a B1 sequence valve 105, a low modulator valve 106, a lockup control valve 107, a lockup solenoid valve SLU 108, a lockup relay valve 109, a solenoid relay valve 110, a primary regulator valve 111, a secondary regulator valve 112, a cooler 113, a cooler bypass valve 114, check valves 115, 123, a throttle solenoid valve 116, a pressure relief valve 117, a solenoid modulator valve 118, a B-1 relay valve 119, an accumulator control valve 120, a hydraulic pump 121, an accumulator 122, a C-1, C-2 orifice control valve 124, an accumulator select valve 125, a 4th-5th shift valve 126, orifices 127-130, an accumulator control solenoid valve 131, the first solenoid valve SL1 for controlling the 2nd-3rd shift valve 104, the second solenoid valve for controlling the 3-4 shaft valve 103, and the third solenoid valve SL3 for controlling the 4th-5th shift valve 126.

In the above-described hydraulic control circuit, when turning on and off the solenoid valves SL1-SL3, SLU is controlled by the electronic controller, the engagement of the clutches C0-C3, the brakes B1-B4, and the one-way clutches F0-F4 is controlled through an on/off combination shown in the table of FIG. 7 so as to realize speed-change stages 1ST-5TH in the ranges P, R, D, 3, 2, 1 of the manual shift valve 101.

Electric current proportional to a signal representing a throttle opening is supplied to the throttle solenoid valve 116. Accordingly, with an increase in the throttle opening due to an increase in the displacement of the accelerator pedal, the plunger of the throttle solenoid valve 116 is pushed upward by electromagnetic force in a direction which closes a line pressure oil passage a and thereby produces throttle pressure, this throttle pressure being applied to the primary regulator valve 111 and the secondary regulator valve 112 via an oil passage b. As a result, the line pressure is regulated to a pressure linearly adjusted to the opening of the throttle valve. By adjusting the current flowing to the throttle solenoid valve 116, it is possible to increase or decrease the line pressure and adjust the actuation period of friction engaging elements such as the clutches and brakes, i.e. the speed-changing time.

The first to third solenoid valves SL1-SL3 are driven in such a manner as to turn on and off the oil flow. Solenoid valves whose pressure is regulated by adjusting the current as described above include the lockup solenoid valve SLU108 and the accumulator control solenoid valve 131 in addition to the aforementioned throttle solenoid valve 116, controlled by the solenoid driving circuit in accordance with the present invention.

For instance, in the case of those friction engaging elements that are controlled by the hydraulic servos C-0 to C-2, B-1 to B-4, a shock occurs if hydraulic pressure is supplied abruptly during a rise in hydraulic pressure. Accordingly, it becomes necessary to provide a pressure accumulating function in order to prevent the abrupt engagement of the frictionally engaging elements and permit smooth engagement by partially absorbing the engaged pressure during engagement. The accumulator 122 performs that function. Even if identical friction engaging elements are used, the torque capacity required to reach speed-change stage differs. For this reason and also to control the degree of engagement of the friction engaging elements, a linear solenoid valve is used for the accumulator control solenoid valve 131, thereby overcoming the aforementioned problems and making versatile use of the accumulator 122.

It should be noted that the present invention is not restricted to the above-described embodiment, and various modifications are possible. For instance, although in the above-described embodiment the Darlington connected transistor or the diode is used, it goes without saying that insofar as the potential difference between the power ground and the signal ground can be compensated for, the potential difference compensating means can be a FET or other switchable element by combining resistors in series. In addition, although a description has been given of a case where the present invention is applied to a linear solenoid for producing line pressure corresponding to throttle opening, the present invention is similarly applicable to other linear solenoids such as a linear solenoid controlling a direct-coupled clutch of a torque converter, and a linear solenoid controlling the back pressure of an accumulator.

As is apparent from the foregoing description, in accordance with the present invention, the solenoid, the resistance element, and the potential difference compensating means are electrically connected in series to monitor the voltage at the opposite ends of the resistance element. Accordingly, even if a potential difference exists between the power ground and the signal ground owing to the voltage differential therebetween, it is possible to monitor the current with high accuracy and to control the current flowing to the solenoid. In addition, since the potential difference compensating means having a switching element is connected to the power ground side, and the circuit is adapted to be shut off of the solenoid driving means side and the potential difference compensating means side, it is possible to shut off the circuit not only when the terminals of the solenoid are short-circuited but also when either the driving side or the power ground side of the solenoid is short-circuited with the supply line of the battery or the ground. Thus it is possible to provide a fail-safe arrangement for the solenoid and prevent excessive discharge of the battery and burning of the potential difference compensating means.

We claim:

1. A solenoid driving circuit for an automatic transmission for a vehicle, comprising:
   a solenoid disposed in a hydraulic controller of the automatic transmission for a vehicle, said hydraulic controller controlling hydraulic pressure supplied thereto;
   solenoid driving means for driving said solenoid with an actuating current;
   setting means for setting a value for said actuating current;
   a resistance element electrically connected in series with said solenoid;
   a Darlington-connected transistor circuit electrically connected between the resistance element and a power ground;
   first detecting means for detecting a voltage of a connecting point between the solenoid and the resistance element, said first detecting means being connected to a signal ground;
   second detecting means for detecting a voltage of a connecting point between the resistance element and the Darlington-connected transistor circuit, said second detecting means being connected to the signal ground;
   monitoring current determining means for receiving the detected voltages of the first and second detecting means and for calculating a monitoring current as a function of a voltage difference between opposite ends of the resistance element;
   controlling means for effecting feedback control of the actuating current by comparing the calculated monitoring current with the set value and generating an error signal on the basis of said comparing, said actuating current being corrected to said set value responsive to said error signal, said controlling mens being connected to a signal ground; and
   wherein said controlling means includes abnormality determining means for determining if the calculated monitoring current is abnormal and for turning off said Darlington-connected transistor circuit when the monitoring current value is determined to be abnormal.

2. The solenoid driving circuit of claim 1 further comprising a pulse width modulated signal outputting means for receiving a basic pulse width signal from said setting means and said error signal and for outputting a pulse width modulated signal at a constant, predetermined frequency to said solenoid driving means.

3. A solenoid driving circuit for an automatic transmission for a vehicle, comprising:
   a solenoid disposed in a hydraulic controller of the automatic transmission for a vehicle, said hydraulic controller controlling hydraulic pressure supplied thereto;
   solenoid driving means for driving said solenoid with an actuating current;
   setting means for setting a value for said actuating current;
   a resistance element electrically connected in series with said solenoid;
   a switching transistor in series with a diode electrically connected between the resistance element and a power ground;
   first detecting means for detecting a voltage of a connecting point between the solenoid and the resistance element, said first detecting means being connected to a signal ground;
   second detecting means for detecting a voltage of a connecting point between the resistance element and the switching transistor, said second detecting means being connected to the signal ground;
   monitoring current determining means for receiving the detected voltages of the first and second detecting means and for calculating a monitoring current as a function of a voltage difference between opposite ends of the resistance element;
   controlling means for effecting feedback control of the actuating current by comparing the calculated monitoring current with the set value and generating an error signal on the basis of said comparing, said actuating current being corrected to said set value responsive to said error signal, said controlling means being connected to a signal ground; and
   wherein said controlling means includes abnormality determining means for determining if the calculated monitoring current is abnormal and for turning off said switching transistor when the monitoring current value is determined to be abnormal.

4. The solenoid driving circuit of claim 3 further comprising a pulse width modulated signal outputting means for receiving a basic pulse width signal from said setting means and said error signal and for outputting a pulse width modulated signal at a constant, predetermined frequency to said solenoid driving means.

* * * * *